(12) United States Patent
Wiener et al.

(10) Patent No.: US 8,317,927 B2
(45) Date of Patent: Nov. 27, 2012

(54) SYSTEMS AND METHODS FOR SEALING IN SITE-ISOLATED REACTORS

(75) Inventors: Kurt H. Wiener, San Jose, CA (US); Aaron Francis, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 77 days.

(21) Appl. No.: 13/080,441

(22) Filed: Apr. 5, 2011

(65) Prior Publication Data

US 2011/0179999 A1    Jul. 28, 2011

Related U.S. Application Data

(62) Division of application No. 11/448,369, filed on Jun. 6, 2006, now Pat. No. 7,955,436.

(51) Int. Cl.
*C23C 16/00* (2006.01)
*H01L 21/306* (2006.01)

(52) U.S. Cl. .................. 118/733; 118/719

(58) Field of Classification Search .......... 118/719, 118/733
See application file for complete search history.

(56) References Cited

U.S. PATENT DOCUMENTS 6,758,951 B2 * 7/2004 Giaquinta et al. .......... 506/32

* cited by examiner

Primary Examiner — Karla Moore

(57) ABSTRACT

Substrate processing systems and methods are described for site-isolated processing of substrates. The processing systems include numerous site-isolated reactors (SIRs). The processing systems include a reactor block having a cell array that includes numerous SIRs. A sleeve is coupled to an interior of each of the SIRs. The sleeve includes a compliance device configured to dynamically control a vertical position of the sleeve in the SIR. A sealing system is configured to provide a seal between a region of a substrate and the interior of each of the SIRs. The processing system can include numerous modules that comprise one or more site-isolated reactors (SIRs) configured for one or more of molecular self-assembly and combinatorial processing of substrates.

4 Claims, 10 Drawing Sheets

SYSTEMS AND METHODS FOR SEALING IN SITE-ISOLATED REACTORS

RELATED APPLICATIONS

This application is a divisional application of U.S. patent application Ser. No. 11/448,369, filed Jun. 6, 2006, which claims the benefit of U.S. patent application Ser.No. 60/776, 370, filed Feb. 24, 2006.

This application relates to U.S. patent application Ser. Nos. 11/132,841, filed May 18, 2005, 11/132,817, filed May 18, 2005, 11/231,047, filed Sep. 19, 2005, 11/284,527, filed Nov. 22, 2005, 60/725,186, filed Oct. 11, 2005, 11/352,077, filed Feb. 10, 2006, 11/352,016, filed Feb. 10, 2006, 11/352,083, filed Feb. 10, 2006, and 11/351,978, filed Feb. 10, 2006.

TECHNICAL FIELD

The disclosed embodiments relate to substrate processing and, more particularly, to substrate processing using site-isolated reactors.

BACKGROUND

In order to execute site-isolated (parallel, serial, and combinations thereof) processing of regions of a substrate (such as but not limited to blanket wafers, patterned wafers, substrates including devices, functional chips, functional devices, and test structures, etc.) without cross-contamination between reactors and/or regions, each reactor and/or region must be effectively isolated from neighboring reactors and/or regions. Typical sealing mechanisms for full scale reactors (e.g. face seals using o-rings) are not well-suited to this task. This is because these seals require a large compressive force and depend solely on the compliance of the o-ring to provide the liquid or gas seal. Also, these seals typically do not use the processed substrate (e.g. silicon) as a sealing surface. As a result, the manufacturing tolerance and the contamination properties are of secondary concern. Therefore there is a need for sealing systems and methods that effectively seal isolated sites during site-isolated substrate processing.

INCORPORATION BY REFERENCE

Each publication, patent, and/or patent application mentioned in this specification is herein incorporated by reference in its entirety to the same extent as if each individual publication, patent and/or patent application was specifically and individually indicated to be incorporated by reference.

Figure 1:
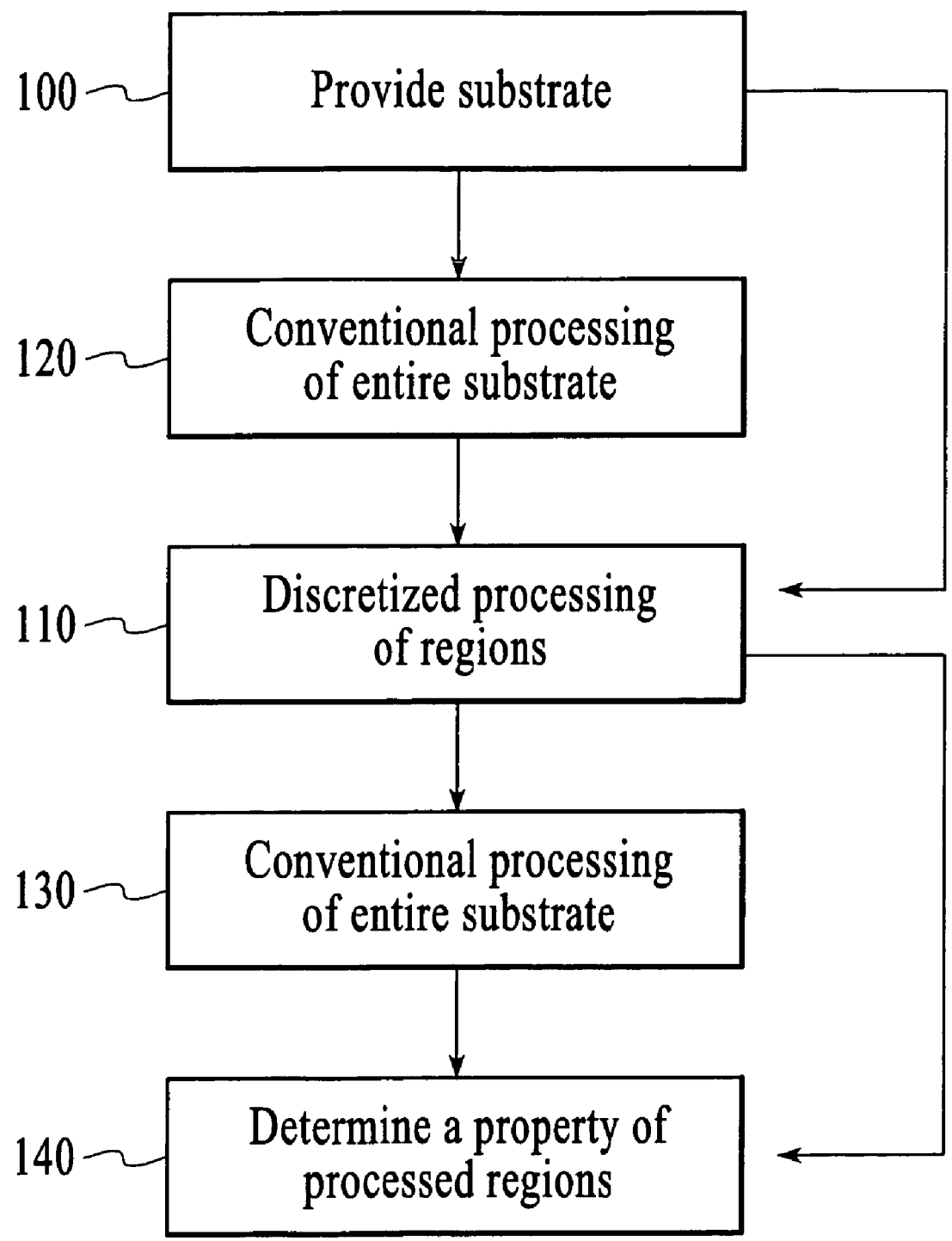
FIG. 1 is a flow diagram for combinatorial process sequence integration, under an embodiment.

In the drawings, the same reference numbers identify identical or substantially similar elements or acts. To easily identify the discussion of any particular element or act, the most significant digit or digits in a reference number refer to the Figure number in which that element is first introduced (e.g., element 124 is first introduced and discussed with respect to FIG. 1).

DETAILED DESCRIPTION

Systems and methods for sealing site-isolated reactors are described below that enable the miniaturization and parallelization of liquid and gas phase reactors for use in the development of processes for the manufacture of integrated circuits and other substrate-based components. Specifically the systems and methods described below provide sealing systems for use in isolating reactions in reactors that are in close proximity to other reactors. The reactors isolated according to the sealing systems and methods described herein include single reactors as well as one or more sets or groups of reactors used in one or more of serial, parallel, and/or serial parallel modes.

The embodiments described below for sealing reactors are for the discovery, implementation, optimization, and qualification of material(s), process(es), and process integration sequence(s) required for integrated circuit (IC) manufacturing, including but not limited to methods for the combinatorial processing of and process sequence integration performed within regions on a single substrate used typically in device fabrication. The embodiments are described herein with regard to processing of integrated circuits (ICs), but can readily be applied in the processing of other types of devices and the investigation of new materials for such uses. Some types of substrates which can be processed in accordance with the embodiments described herein include, for example, blanket wafers, patterned wafers, and substrates including devices, functional chips, functional devices, and test structures. More particularly, substrates which can be processed in accordance with the embodiments herein include, but are not limited to, semiconductor devices, flat panel displays, optoelectronic devices, data storage devices, magnetoelectronic devices, magnetooptic devices, molecular electronic devices, solar cells, photonic devices, and packaged devices, or other devices.

The site-isolated reactors described below are used for example in processing substrates having an array of differentially processed regions wherein each region of a substrate is processed by delivering materials to or modifying regions of the substrate. Processing includes but is not limited to physical modifications, chemical modifications, electrical modifications, thermal modifications, magnetic modifications, photonic modifications, and photolytic modifications, more specifically cleaning, surface modification, surface preparation, deposition, dispensing, reaction, functionalization, etching, planarization, chemical mechanical planarization, electrochemical mechanical planarization, lithography, patterning, implantation, irradiation, electromagnetic irradiation, microwave irradiation, radio frequency (RF) irradiation, thermal treatment, infrared (IR) treatment, ultraviolet (UV) treatment, deep ultraviolet (DUV) treatment, extreme ultraviolet (EUV) treatment, electron beam treatment, and x-ray treatment, and more specifically electrochemical deposition, electroless deposition, physical vapor deposition, chemical vapor deposition, atomic layer deposition, vapor phase epitaxy, liquid phase epitaxy, chemical beam epitaxy, molecular beam epitaxy, molecular self-assembly, and evaporation. As such, the embodiments described below provide methods and systems for the combinatorial processing and analysis of regions of a substrate.

In the following description, numerous specific details are introduced to provide a thorough understanding of, and enabling description for, embodiments of the reactor sealing mechanisms. One skilled in the relevant art, however, will recognize that the embodiments herein can be practiced without one or more of the specific details, or with other components, systems, etc. In other instances, well-known structures or operations are not shown, or are not described in detail, to avoid obscuring aspects of the embodiments.

Substrate processing generally includes processing an array of regions by delivering processing materials to pre-defined regions on a substrate and/or modifying the pre-defined regions. FIG. 1 is a flow diagram for combinatorial process sequence integration, under an embodiment. The processing of an embodiment uses a processing tool (which may or may not be an integrated tool comprised of discrete unit modules which collectively perform the effective unit process) that will perform the pre-specified process. In one embodiment, the processing tool can perform the process in a discretized fashion within unique regions contained in a single monolithic substrate, such as a wafer used in IC manufacturing. The substrate is provided to the system 100, and is processed in a discretized, isolated, fashion (either in a serial, parallel, or serial-parallel mode) in which at least two regions of the substrate are processed differently from each other 110. The substrate processed in this combinatorial fashion can optionally be previously 120 and/or subsequently 130 processed in a conventional fashion with at least one other process, wherein the entire or substantially close to the entire substrate sees the same processing conditions. This allows the described combinatorial processing/combinatorial process sequence integration approach to be used in desired segments of the process flow required to build an end device(s) (e.g. integrated circuit, etc).

The processed regions of the substrate, such as devices or portions of devices created, can then be tested 140 for a property of interest using conventional methods for analysis, such as parametric testing for properties and/or reliability testing for example. The processed regions can be tested simultaneously, sequentially, or in a parallel-serial mode, where a first plurality of regions is simultaneously tested, followed by a second plurality of regions being simultaneously tested. The testing 140 is optionally performed in one or more alternative embodiments of the methodology for combinatorial process sequence integration.

The combinatorial process sequence integration of an embodiment uses a processing tool referred to herein as a site-isolated processing tool that performs one or more processes. In one embodiment, the site-isolated processing tool processes a substrate in a discretized, isolated fashion (either in a serial, parallel, or serial-parallel mode) within unique regions of the substrate (e.g., at least two regions of the substrate are processed differently from each other). In processing an array of regions, as described herein, processing materials can be delivered to regions (including predefined regions) on a substrate and/or the regions (including pre-defined regions) can be modified using any number of site-isolated processing processes or sequences in combination with any number of conventional processing processes or sequences.

For example, a method under the combinatorial process sequence integration of an embodiment receives a substrate from at least one first process selected from a group consisting of depositing, patterning, etching, cleaning, planarizing, implanting, and treating. The method generates a processed substrate by processing at least one region of the substrate differently from at least one other region of the substrate. The processing includes modifying the at least one region, wherein modifying includes at least one of physical modifications, chemical modifications, electrical modifications, thermal modifications, magnetic modifications, photonic modifications, and photolytic modifications, wherein the processing forms at least one array of differentially processed regions on the substrate. In one embodiment, the processing includes modifying using at least one of materials, processing conditions, process sequences, process sequence integration, and process sequence conditions. In one other embodiment, the processed substrate is provided to at least one additional process selected from a group consisting of depositing, patterning, etching, cleaning, planarizing, implanting, and treating.

As another example, a method under the combinatorial process sequence integration herein generates a processed substrate by processing at least one region of the substrate differently from at least one other region of the substrate. The processing includes modifying the at least one region, wherein modifying includes at least one of physical modifications, chemical modifications, electrical modifications, thermal modifications, magnetic modifications, photonic modifications, and photolytic modifications, wherein the processing forms at least one array of differentially processed regions on the substrate. The method continues by providing the processed substrate to at least one additional process selected from a group consisting of depositing, patterning, etching, cleaning, planarizing, implanting, and treating. In one embodiment, the processing includes modifying using at least one of materials, processing conditions, process sequences, process sequence integration, and process sequence conditions.

Figure 2B:
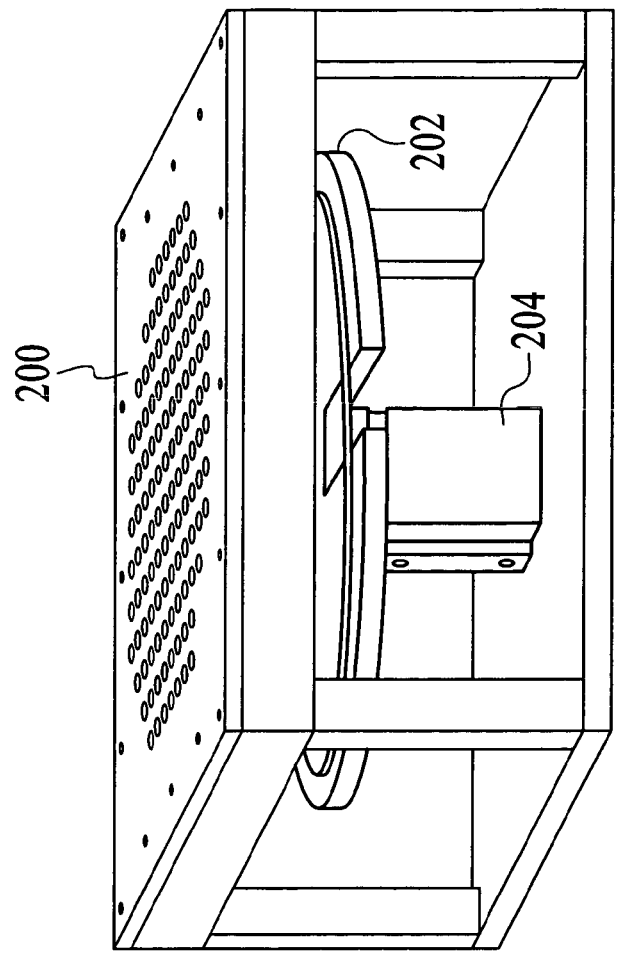
FIGS. 2A, 2B, and 2C show embodiments for site-isolated processing of regions of a substrate, such as combinatorial process sequence integration, under an embodiment.
Figure 2A:
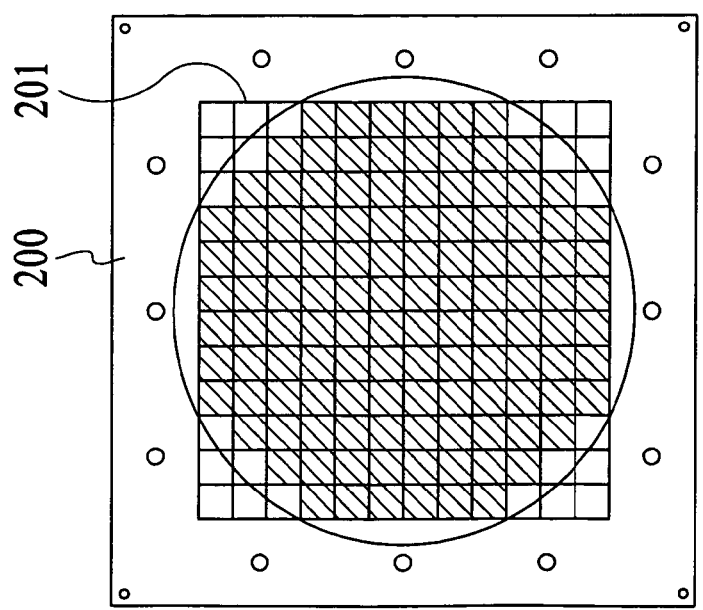
Figure 2C:
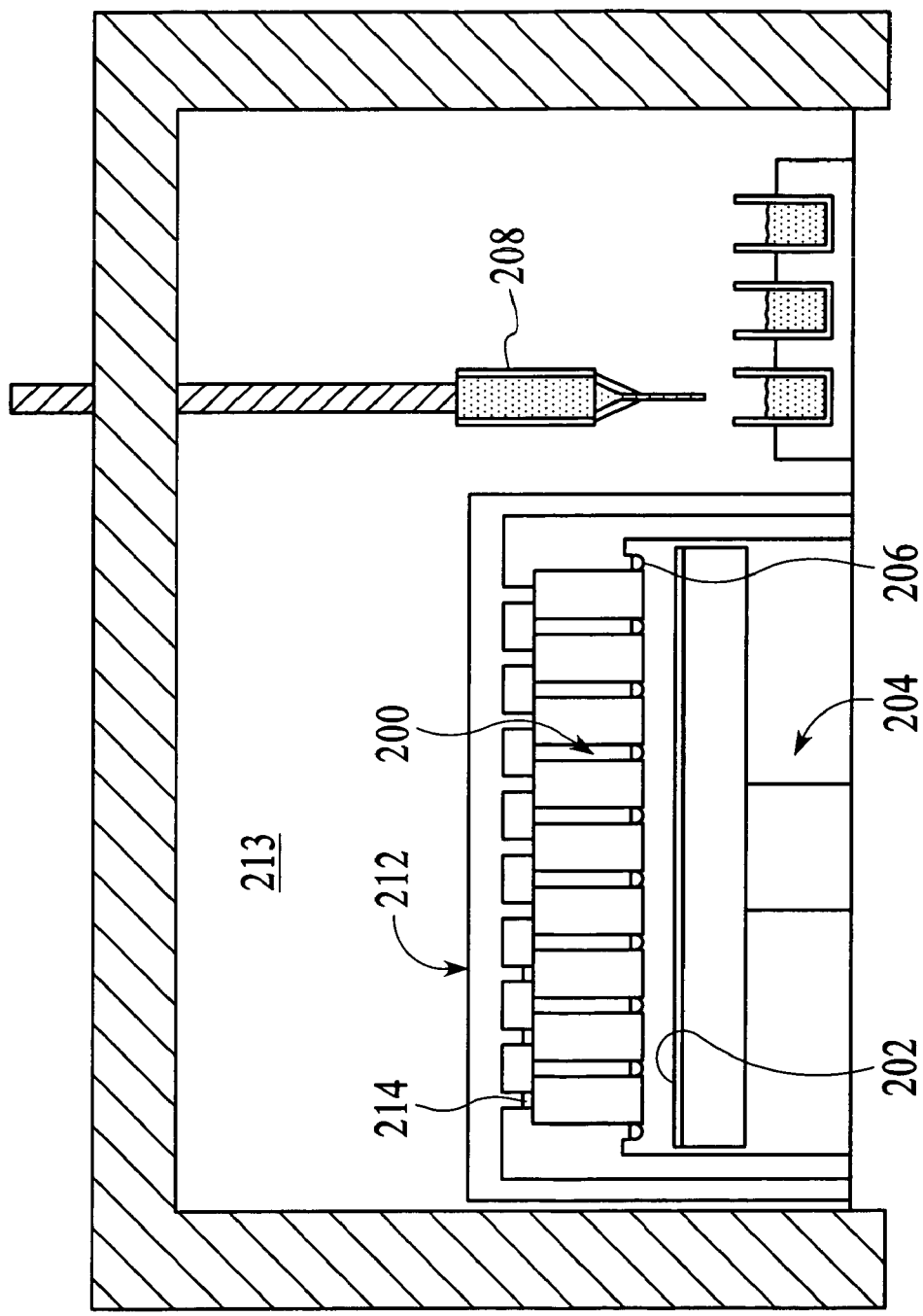

As one example of site-isolated processing, FIGS. 2A, 2B, and 2C show embodiments for site-isolated processing of regions of a substrate, such as combinatorial process sequence integration of wet processes used in IC and related manufacturing. FIG. 2A shows a bottom view of collection of processing cells in a unitary structure 200, for example, in which the processing cells correspond to the individual die locations or portions of individual die locations within a single monolithic substrate, such as a wafer. The cross-section shape of the processing cells is not limited to a particular shape. For example, the processing cells of structure 200 have an approximately square design. In other embodiments the processing cells of the structure 200 can have a circular cross-section (described in FIGS. 3 and 4 below).

In some embodiments, the structure 200 is designed to receive a sealing element for creating a seal between the structure 200 and the substrate during processing. In one embodiment, the structure 200 includes a groove 201 for receiving a single seal 206 that is adapted to provide a sealing element around each processing cell of the structure 200. In another embodiment, the structure can utilize several seals for groups or individual cells of the structure as described below.

As discussed above for the embodiments utilizing single processing cells, the structure 200 can also include inserts for each processing cell. The inserts can be designed to be disposable and optionally can be adapted to be used for specific types of processing. In this manner, different processes can be conducted on different regions by using different inserts in different cells of the structure.

Each processing cell of the structure 200 can be used to process a unique region on the substrate 202 in a unique fashion. Each unique site isolated processing cell can also be used to perform a unique sequence of unit processes. FIG. 2B shows a multiprocessing cell array 200 mated to a stage 204 which can hold the monolithic substrate 202. Positioning and alignment techniques can be used to align and position the cell array 200 such that the cell array 200 is aligned to each corresponding die on the substrate 202. This can be achieved using alignment pins in conjunction with stepper motors, or optical alignment, and/or other known techniques to move the substrate with respect to the multi-processing cell array.

A sealing element 206 such as individual elastomeric seals, e.g. o-rings, corresponding to each unique cell, or a preformed monolithic elastomeric seal can be used to form a seal when the processing cell array 200 is brought into contact with the substrate 202. The elastomeric seal 206 is chosen to be chemically inert and/or stable with respect to the process and/or processing environment. For example, the elastomeric seal of an embodiment can be constructed of a material such as Kalrez, Viton or Chemrez. Other sealing materials compatible with the process and/or processing environment of interest can be used as appropriate. The sealing element 206 is made to fit into the multiprocessing array 200 (such as in the groove 201) and is designed such that when in contact with the substrate 202, each discrete region of the substrate 202 will be isolated from other regions or portions of the substrate 202. In this particular example, the stage is motorized so as to be able to move the substrate 202 vertically until such sealing can be achieved. Dispensing, placing, processing, etc. within each cell can be achieved using a serial dispenser 208 shown in FIG. 2C or in a parallel fashion with multiple dispensers (not shown).

An example of a structure for use in site-isolated processing of unique regions on a substrate includes the use of seals between reactors of the cell array and one or more regions of a target substrate. The sealing systems and methods of an embodiment include two classes of seals. A first class of seal includes one or more contact seals while a second class of seal includes use of a hydrodynamic barrier formed using a sealing fluid. Each of these seals is described in detail below.

Figure 3:
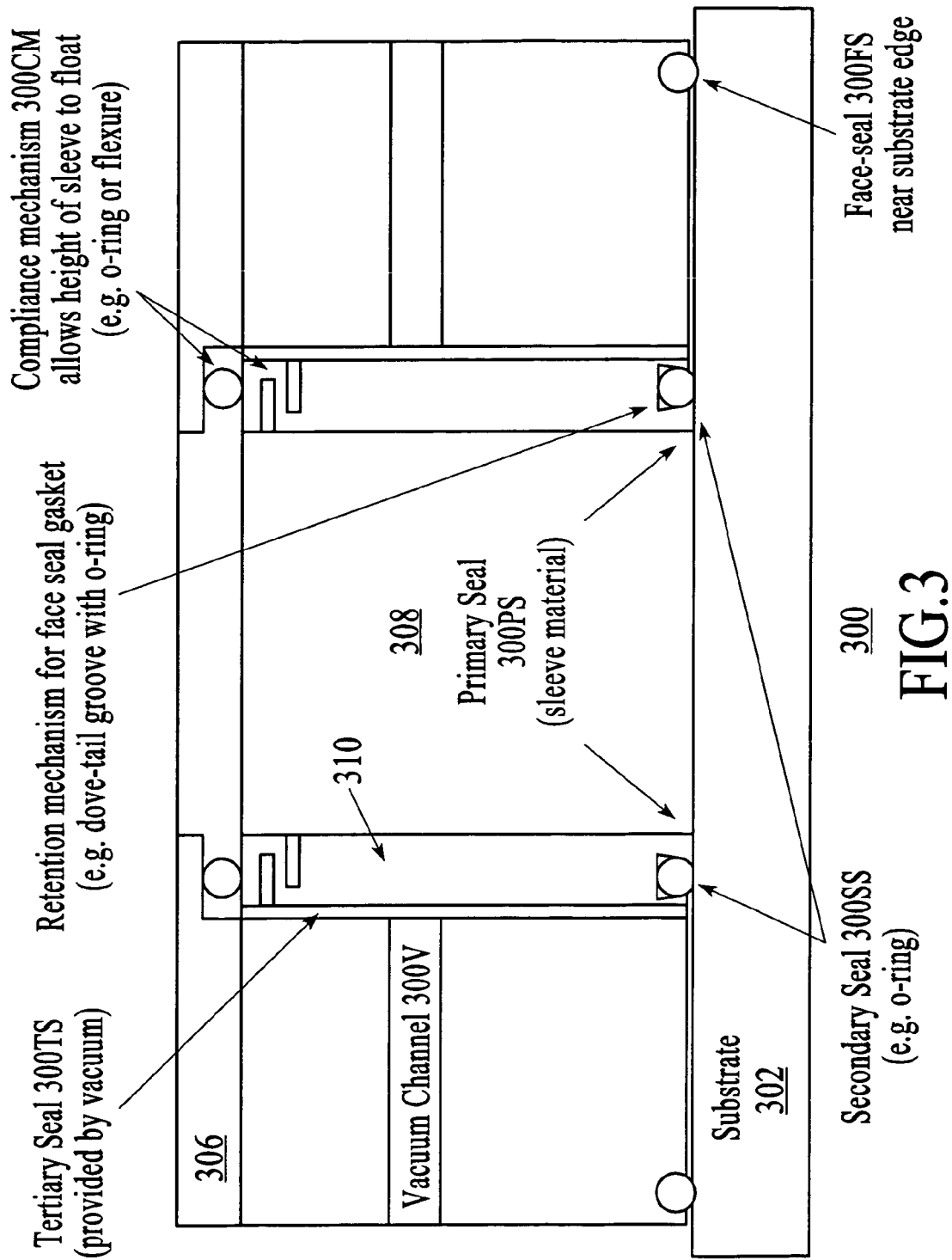
FIG. 3 shows a contact sealing system, under an embodiment.

The first class of seal, referred to herein as a contact sealing system, uses a series of seals to enable effective containment of isolated reactions of reactors of a cell array while improving the sealing properties at lower sealing forces. The reactors isolated according to the sealing systems and methods described herein include single reactors as well as one or more sets or groups of reactors used in one or more of serial, parallel, and/or serial parallel modes. FIG. 3 shows a contact sealing system 300, under an embodiment. The contact sealing system 300 is used in a multiprocessing cell array 306 in order to provide multiple site-isolated reactors 308 for combinatorial processing of portions of the substrate 302 as described above. The contact sealing system 300 of an embodiment includes a floating reactor sleeve 310 along with a series of seals. A compliance mechanism 300CM is configured to allow a position (e.g. height) of the floating seal 310 to "float" so that the reactor 308 is dynamically configurable to contact individual portions of the substrate 302, as described below.

The series of seals of an embodiment comprise one or more of an inert semi-compliant material of the floating sleeve 310 that is configured to provide a primary seal 300PS of the reactor 308, an o-ring configured to provide a secondary seal 300SS for secondary containment of the primary seal 300PS, and a perimeter o-ring configured to provide a face seal 300FS. The contact sealing system 300 of an embodiment also includes vacuum configured to provide a tertiary seal 300TS. The face seal 300FS is configured to contact the substrate 302 to ensure effective sealing by the tertiary seal. This perimeter seal allows for establishment of a face seal to the substrate using the vacuum or alternatively using pneumatic force. The components of the contact sealing system 300 are described in detail below.

The contact sealing system 300 thus provides site-isolated reactors with at least three levels of containment within a relatively small space. Effective seals can therefore be achieved with lower resulting compressive force on target substrate because the multiple levels of containment ensure that no mixing of reactants takes place between adjacent reactors.

Figure 3A:
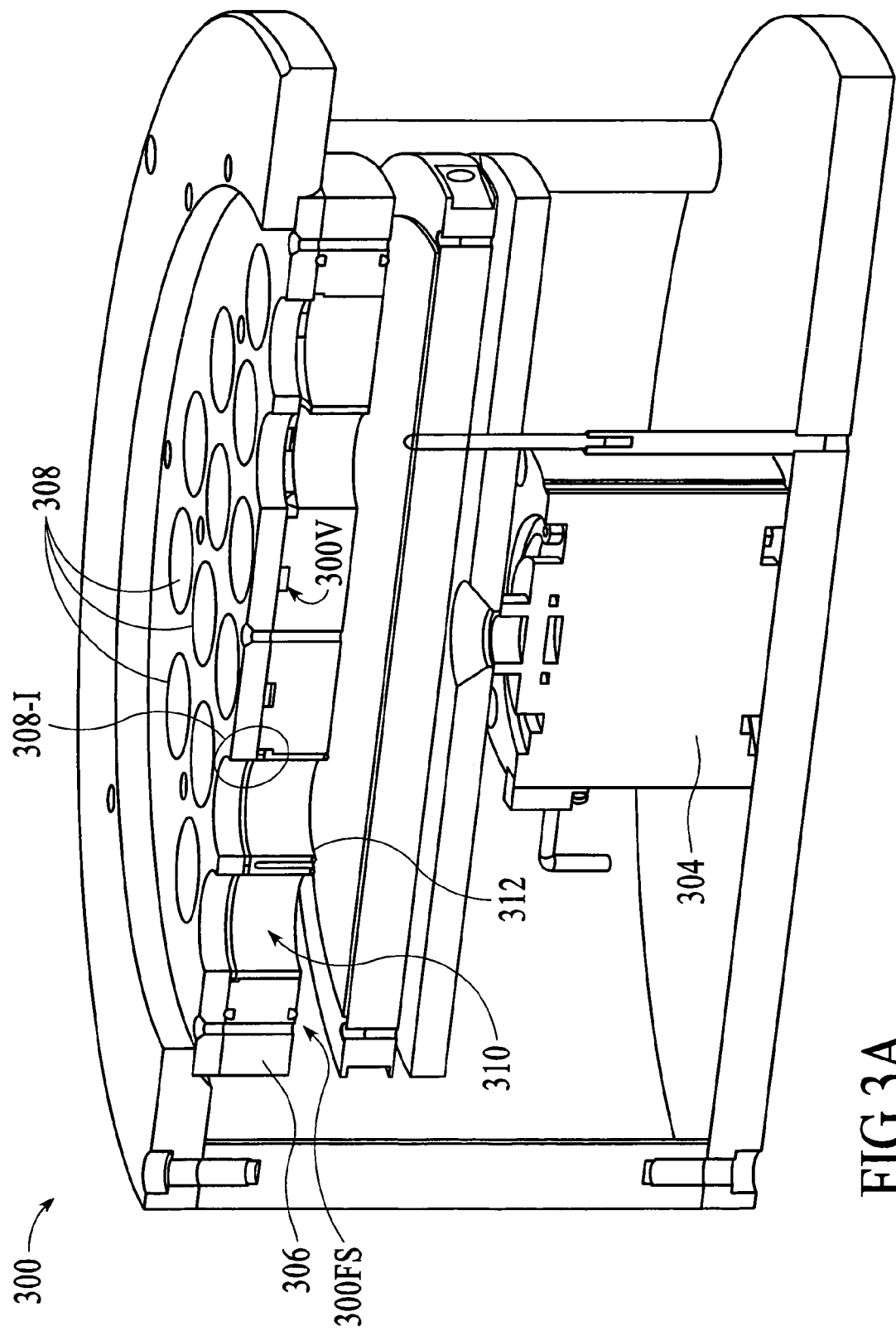
FIG. 3A shows a contact sealing system in a multiprocessing cell array mated to a stage which can hold a substrate, under an embodiment.

FIG. 3A shows a contact sealing system 300 in a multiprocessing cell array 306 mated to a stage 304 which can hold a substrate, under an embodiment. The contact sealing system 300 of an embodiment includes a floating reactor sleeve or wall 310. A floating reactor sleeve 310 is configured to float or be dynamically positionable in each reactor 308 of the cell array reactor block 306. The combination of the reactor 308 that includes the floating sleeve 310 thus forms a reactor 308 that provides individual compliance of each reactor edge surface 312 (formed by the floating sleeve 310) with a localized surface of a substrate.

The compliance of each reactor sleeve 310 within the reactor 308 of the reactor block 306 can be controlled or provided by an external mechanism which, in an embodiment, is an o-ring 314 (FIG. 3B), but is not so limited. The compliance of each reactor sleeve 310 within the reactor 308 can also be provided by a flexure-type mechanism integrated directly into the sleeve wall. Each of the reactor sleeve compliance mechanisms are described in detail below. Use of the floating sleeves 310 in each reactor 308 allows for replacement of individual reactor walls that may become contaminated or otherwise unsuitable for continued use in a reactor. Further, the floating of each reactor 308 within the reactor block 306 provided by the floating sleeves 310 allows larger manufacturing tolerances of reactor components while still providing a high probability that a seal is achieved for each reactor.

A first embodiment of the contact sealing system uses an external compliance mechanism (FIG. 3, 300CM) in an upper portion of the reactor for controlling or providing compliance of a floating sleeve 310-B with the wall of the reactor 308. The first embodiment also uses a series of seals that includes the inert semi-compliant material as a primary seal, an o-ring for secondary containment of the primary seal, and a perimeter o-ring face seal. The floating sleeve 310-B of an embodiment comprises a virgin resin electrical grade thermoplastic fluoropolymer like polytetrafluoroethylene (PTFE) (Teflon®), but is not limited to this material as other materials may be used as appropriate to the reactions of particular reactors. The dimensions shown (dimensions are inches) in the following figures are examples of the floating sleeve 310-B of an embodiment and are representative only; the dimensions are not provided to limit the embodiment.

Figure 3B:
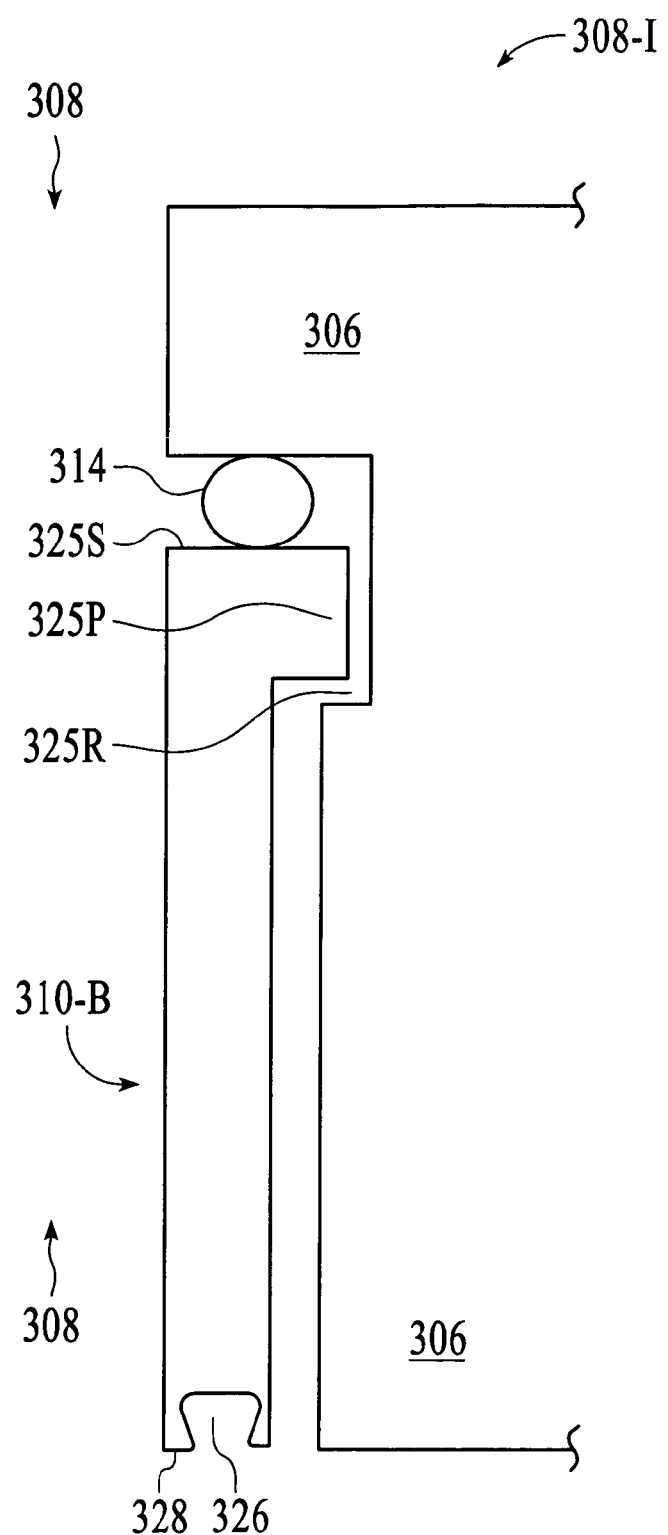
FIG. 3B and FIG. 3C show multiple views of a floating sleeve configured to interface with an external mechanism for compliance within the reactor and to include a seal system in a lower region, under an embodiment.
Figure 3C:
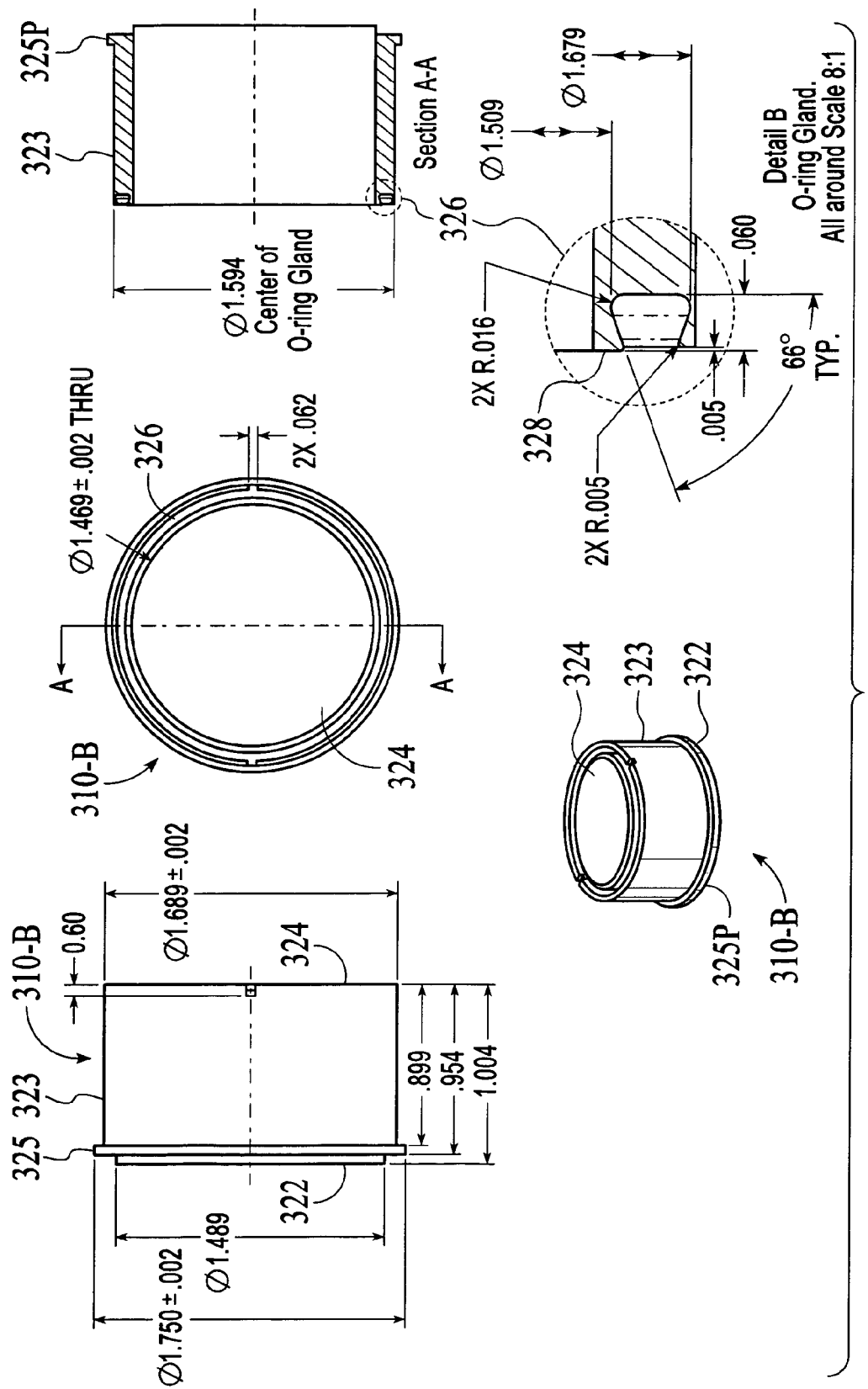

FIG. 3B and FIG. 3C show multiple views of a floating sleeve 310-B configured to interface with an external mechanism (e.g. o-ring 314) for compliance within the reactor 308 and to include a seal system in a lower region 324, under an embodiment. The floating sleeve 310-B includes an upper region 322 and a lower region 324 connected by a wall 323. The floating sleeve 310-B and consequently the reactor 308 of this embodiment are circular but may take on a number of different shapes in different embodiments as appropriate to a processing system. The upper region 322 of the floating sleeve 310-B includes the external compliance mechanism that in an embodiment includes a protrusion 325P and a surface 325S. The surface 325S is configured to interface or couple with a compliance o-ring 314. The surface of an embodiment is a smooth flat surface but is not so limited, and alternative embodiments can include grooves or other depressions that couple with the compliance o-ring 314. Alternatively, the compliance o-ring 314 can be permanently or removeably connected to the surface 325S.

The protrusion 325P of the floating sleeve 310-B couples with a recess 325R in the reactor block 306 and, in conjunction with the compliance o-ring 314, controls float of the sleeve 310-B in the reactor 308 over a pre-specified range of motion. The range of motion of an embodiment is therefore determined by dimensions and/or properties of material of the compliance o-ring 314 along with a dimension of the recess 325R in the reactor block 306.

The contact sealing system of an embodiment includes a primary and a secondary seal formed in the lower region 324 of the sleeve 310-B. The primary seal 328 of an embodiment is formed using an inert semi-compliant region or material of the sleeve 310-B. The primary seal 328 is positioned in a lower region of the floating sleeve 310 and is formed from a groove 326 in the bottom of the sleeve 310-B but is not so limited. The groove 326 of an embodiment is a dove-tail groove that is configured to retain a face seal but is not so limited. The lower region 324 of the floating sleeve 310-B is configured to receive and contain for example an o-ring seal (FIG. 3, secondary seal 300SS) in the groove 326. The o-ring seal, when positioned in the groove 326, provides secondary containment of a reaction in the reactor 308 while the primary seal 328 (inner wall of the floating sleeve 310-B) provides primary containment of the reaction through approximately direct contact with the substrate.

Figure 3D:
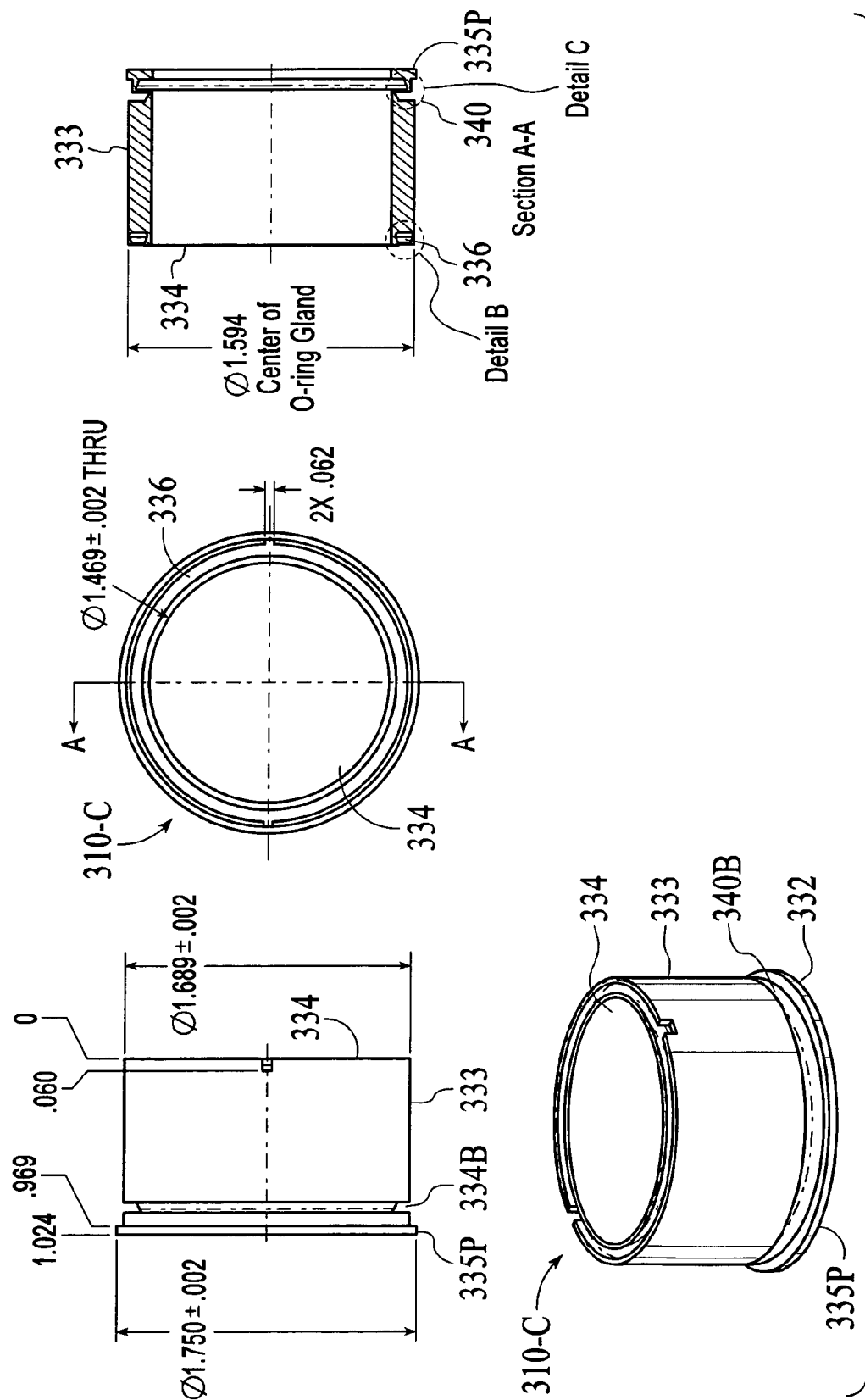
FIG. 3D and FIG. 3E show multiple views of a floating sleeve configured to include a flexure compliance mechanism for compliance within the reactor and a seal system in a lower region, under an embodiment.
Figure 3E:
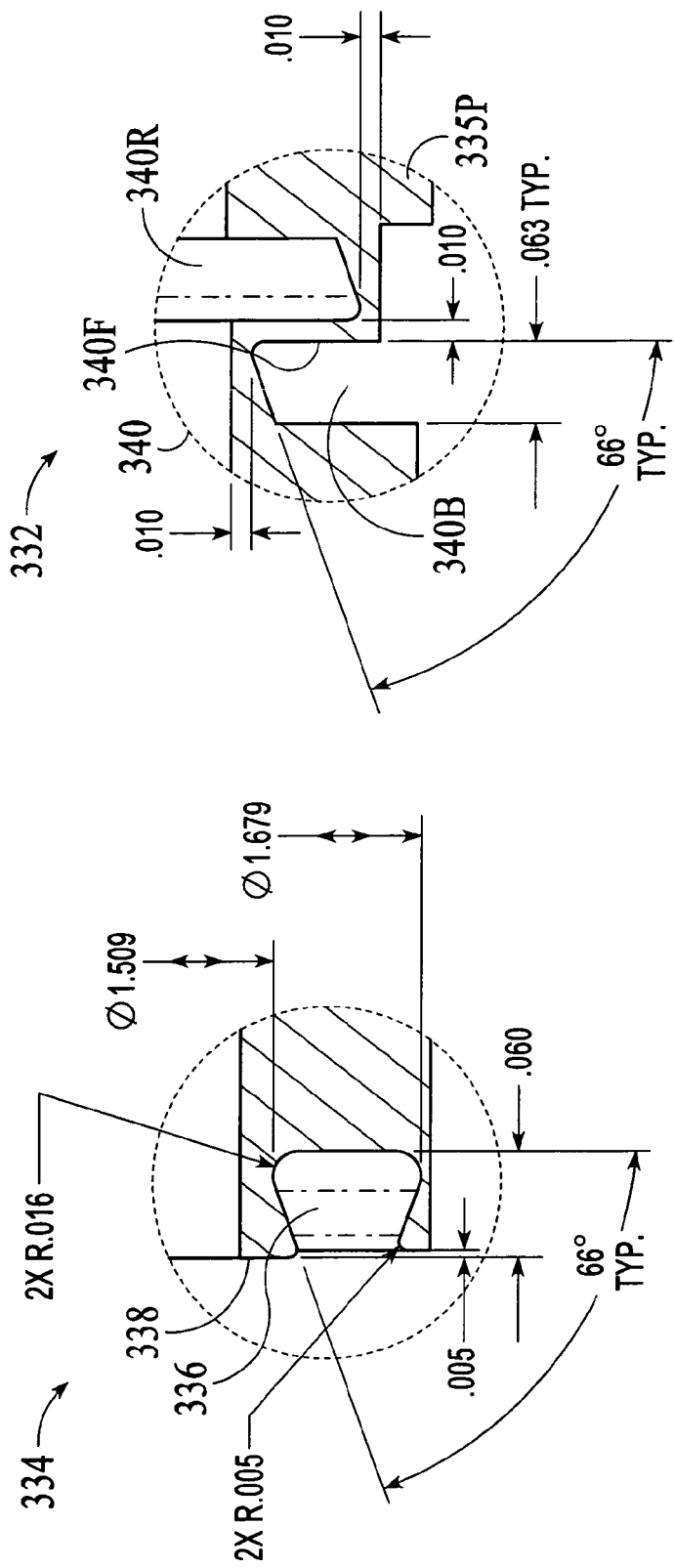

The compliance of each floating reactor sleeve 310 within the reactor 308 of the reactor block 306 can alternatively be controlled by a flexure-type compliance mechanism 340 integrated or contained in the wall 333 of the floating sleeve 310. FIG. 3D and FIG. 3E show multiple views of a floating sleeve 310-C configured to include a flexure compliance mechanism 340 for compliance within the reactor 308 and a seal system in a lower region 334, under an embodiment. The floating sleeve 310-C includes an upper region 332 and a lower region 334 connected by a wall 333. The floating sleeve 310-C and consequently the reactor 308 of this embodiment are circular but may take on a number of different shapes in different embodiments as appropriate to a processing system. The floating sleeve 310-C of an embodiment comprises a virgin resin electrical grade thermoplastic fluoropolymer like polytetrafluoroethylene (PTFE) (Teflon®), but is not limited to this material. The dimensions shown (dimensions are inches) in the following figures are examples of the floating sleeve 310-C and are representative only; the dimensions are not provided to limit the embodiment.

The upper region 332 of the floating sleeve 310-C is configured to include the flexure mechanism 340 that couples with an upper portion of the reactor block 306. The flexure mechanism includes a set of grooves 340R and 340B or notches in an upper portion of the wall of the floating sleeve 310-C. The set of grooves of an embodiment include opposing grooves so that an aperture of a first groove 340B faces the reactor block 306 and an aperture of a second groove 340R faces the reactor 308. The configuration of the opposing grooves 340R and 340B forms a thin compliant flange 340F between the grooves 340R and 340B that allows the upper portion of the floating sleeve 310-C to flex such that the lower surface 312 complies with the position of the substrate 202. Therefore, the floating sleeve 310-C floats within the reactor 308 so that the primary seal 338 "finds" or contacts a surface of the substrate. Once the floating sleeve 310-C is positioned relative to the substrate surface, the floating sleeve 310-C will flex so that an upper portion of the floating sleeve 310-C comes into firm contact with a portion of the reactor block 306 so as to maintain the position of the floating sleeve 310-C in the reactor block 306 during such time as a reaction is taking place in the reactor 308. In this manner the flexure compliance mechanism 340 controls compliance between the floating sleeve 310-C, the reactor block 306, and the substrate 202, which is clamped together either by vacuum or pneumatic force as described below. The thickness of the thin compliant flange 340F can be varied to provide a predetermined stiffness and resulting force on the primary sealing surface 338 and/or secondary compliant seal described below.

The upper region 332 of the floating sleeve 310-C also includes a protrusion 335P configured to couple with a recess (not shown) in the reactor block 306 and, in conjunction with the flexure compliance mechanism 340 controls float of the sleeve 310-C in the reactor 308 over a pre-specified range of motion. The range of motion of an embodiment is therefore determined by a dimension of the recess in the reactor block 306.

The contact sealing system of an embodiment includes a primary and a secondary seal formed in the lower region 334 of the sleeve 310-C. The primary seal 338 of an embodiment is formed using an inert semi-compliant region or material of the sleeve 310-C. The primary seal 338 is positioned in a lower region of the floating sleeve 310-C and is formed from a groove 336 in the bottom of the sleeve 310-C but is not so limited. The lower region 334 of the floating sleeve 310-C is configured to receive and contain for example an o-ring seal (not shown) in the groove 336. The o-ring seal, when positioned in the groove 336, provides secondary containment of a reaction in the reactor 308 while the primary seal 338 (inner wall of the floating sleeve 310-C) provides primary containment of the reaction through approximately direct contact with the substrate.

The system of an embodiment uses vacuum to provide a tertiary seal as described above. The vacuum is provided via a series of vacuum channels 300V (FIG. 3A) in or through the reactor block 306. The vacuum works in conjunction with the face seal 300FS, which is configured to contact the processed substrate to ensure effective sealing by the tertiary seal. This face seal 300FS therefore establishes a perimeter seal to the substrate using the vacuum or alternatively using pneumatic force.

With reference to FIG. 3A, the plenum area external to the isolated reactor chambers 308 of an embodiment can be pressurized. The pressurization is used, for example, to prevent leakage of materials outside of each isolated reactor chamber 308. Also, pressurizing the plenum and then measuring the pressure drop over time allows for monitoring of the sealing performance of the floating sleeves 310. Furthermore, pressurization of the plenum prevents or minimizes the chance of release or uncontrolled venting of potentially toxic compounds from the isolated reactor chambers 308.

The contact sealing systems described above are provided as examples of integration into a site-isolated reactor of one or more of the floating sleeve, compliance mechanism, inert semi-compliant material of the floating sleeve configured to provide a primary seal of the reactor, an o-ring configured to provide a secondary seal for secondary containment of the reactor primary seal, and/or a perimeter o-ring configured to provide a face seal. Reactors of various alternative embodiments can include any of the floating sleeve, compliance mechanism, primary reactor seal (e.g. material of the floating sleeve, etc.), secondary reactor seal (e.g. o-ring, etc.), and/or perimeter face seal (e.g. o-ring, etc.) individually or in any combination. Thus, each of the floating sleeve, compliance mechanism, primary reactor seal (e.g. material of the floating sleeve, etc.), secondary reactor seal (e.g. o-ring, etc.), and/or perimeter face seal (e.g. o-ring, etc.) is not limited to use with another or any particular ones of the floating sleeve, compliance mechanism, primary reactor seal (e.g. material of the floating sleeve, etc.), secondary reactor seal (e.g. o-ring, etc.), and/or perimeter face seal (e.g. o-ring, etc.).

As one example of an alternative embodiment, a site-isolated reactor can include only the floating sleeve and the compliance mechanism described above. As another example of an alternative embodiment, a site-isolated reactor can include only the floating sleeve, the compliance mechanism, and the primary reactor seal described above. In yet another alternative embodiment, a site-isolated reactor can include only the floating sleeve, the compliance mechanism, and the perimeter face seal described above. As still another alternative embodiment, a site-isolated reactor can include only the floating sleeve and the primary reactor seal described above. A further alternative embodiment of the site-isolated reactor can include only the floating sleeve and the secondary reactor seal described above. The alternative embodiments described above are provided as a few examples of various other combinations of the floating sleeve, compliance mechanism, primary reactor seal (e.g. material of the floating sleeve, etc.), secondary reactor seal (e.g. o-ring, etc.), and/or perimeter face seal (e.g. o-ring, etc.) in a reactor, and other alternative embodiments are possible hereunder.

As an alternative to the contact sealing system described above a second class of seal, referred to herein as a hydrodynamic sealing system, uses a sealing fluid to contain reactor contents by forming a hydrodynamic barrier between reactors of a multiprocessing cell array. The hydrodynamic barrier takes the place of one or more conventional contact seals. The hydrodynamic sealing system 400 is used in a multiprocessing cell array in order to provide multiple site-isolated reactors 408 for combinatorial processing of portions of the substrate 402 as described above.

Figure 4:
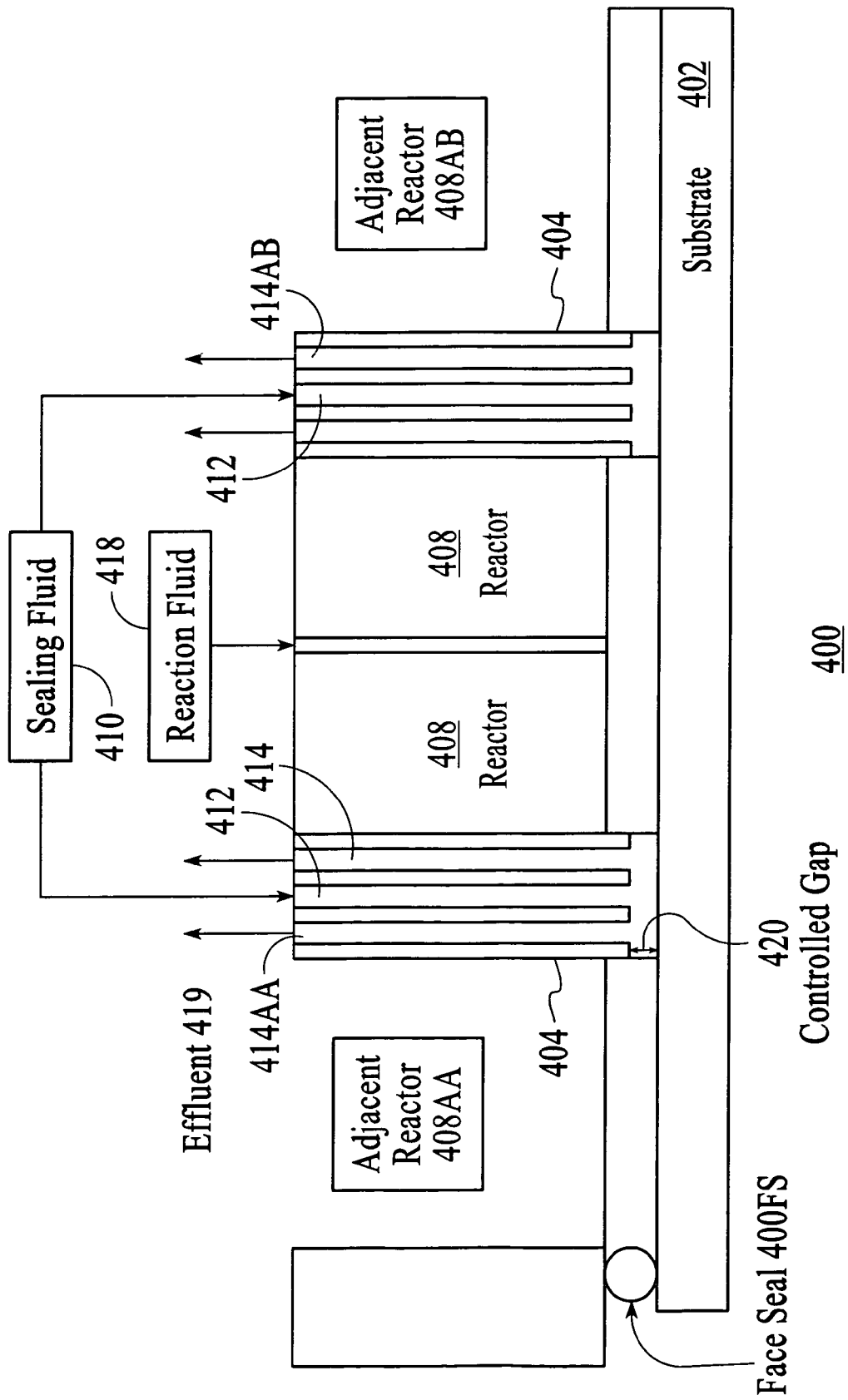
FIG. 4 shows a hydrodynamic sealing system, under an embodiment.

FIG. 4 shows a hydrodynamic sealing system 400, under an embodiment. The hydrodynamic sealing system 400 uses a sealing fluid 410 to form a hydrodynamic barrier configured to be the primary containment that isolates each reactor 408 of a multiprocessing cell array from a number of adjacent reactors 408AA and 408AB. The hydrodynamic sealing system 400 of an embodiment also includes a face seal 400FS in a region of the perimeter of a substrate. The face seal 400FS encapsulates approximately the entire area of a substrate 402 and provides secondary containment of the reaction species. The sealing fluid 410 is inert to the reaction of one or more of the reactors 408, 408AA, 408AB so that the sealing fluid 410 does not introduce contamination to any reaction of any reactor 408, 408AA, 408AB.

The hydrodynamic seal is provided by positioning the reactors above a surface of the substrate 402 without substrate contact. The positioning of the reactors in proximity to the substrate 402 results in formation of a controlled gap 420 between the bottom portion of the reactors and the substrate 402. The reactors therefore do not come into physical contact with the substrate. The span of the controlled gap 420 can be modulated via the characteristics (e.g., fluid constituents, hydrophobicity, hydrophilicity, reactivity, viscosity, etc.) of the sealing fluid 410 and/or the reactants of the reactors 408, 408AA, 408AB.

A hydrodynamic bearing mechanism controls the float height of the reactors 408 above the substrate, and thus the controlled gap 420, by controlling respective pressures of the sealing fluids 410 and the effluent channel but is not so limited. The sealing fluid 410 is introduced into the hydrodynamic sealing system 400 through a first set of channels 412 in a perimeter space 404 or wall of the reactor 408. The first set of channels 412 of an embodiment includes one channel but alternative embodiments can include any number or type of channels or passageways. Reaction fluid 418 is also introduced into the reactor 408 and contained in the reactor 408 for the duration of a static reaction involving the reaction fluid 418. The sealing fluid 410 serves to form a hydrodynamic barrier that contains the reaction fluid 418 in the reactor 408 to which it is introduced. In one embodiment, this can be achieved by choosing an appropriate (e.g. higher) flow of the sealing fluid 410 and/or (e.g. short) process duration to limit out-diffusion of the reaction fluid 418 from the reactor 408 to which it is introduced. The hydrodynamic seal thus encapsulates a specific area or region of the substrate 402 within the reactor 408 by limiting the edge-to-edge flow of the reaction fluid 418 to the approximate boundaries established by the sealing fluid 410. Upon completion of a reaction, the reaction fluid 418 is removed from the reactor 408 (e.g. via suction) but is not so limited.

The sealing fluid 410 is collected along with reaction effluents 419 through a second set of channels 414 in a perimeter space 404 of the reactor 408. The second set of channels 414 of the reactor perimeter space 404 is located between the first set of channels and the reactor to which the channels 414 correspond, in an area defined as a sealing channel. The second set of channels 414 of an embodiment includes one channel but alternative embodiments can include any number or type of channels or passageways. The hydrodynamic sealing system of an embodiment includes a vacuum source for collecting the sealing fluid 410 and/or reaction effluents 419 through the second set of channels 414.

The hydrodynamic sealing system described above provides reactor-to-reactor isolation without having reactor components in direct physical contact with the substrate, thereby reducing or eliminating the possibility of reaction contamination due to physical contact with the reactor. The hydrodynamic sealing system also provides two levels of containment to ensure no leakage of reactants to the atmosphere.

The sealing systems described above seal using the substrate surface as one face of the seal. Further, the sealing systems minimize or eliminate the impact of the seal formation (e.g. abrasion, residue, etc.) on both the substrate and the reaction occurring within the miniaturized reactor. Additionally, the sealing systems maximize the internal reaction area compared to the area of the seal. Also, because embodiments may use tens to hundreds of seals per processed substrate, the sealing systems incorporate a very low probability for failure as well at a very low fatigue rate so that the same seal can be used many times without replacement.

The hydrodynamic sealing system described above is provided as an example of integration into a reactor one or more of the hydrodynamic barrier and/or face seal. Reactors of various alternative embodiments can include any of the hydrodynamic barrier and/or face seal alone or in combination. Furthermore, various alternative embodiments of a reactor can include the hydrodynamic barrier along with one or more of the floating sleeve, compliance mechanism, inert semi-compliant material of the floating sleeve configured to provide a primary seal of the reactor, the o-ring configured to provide a secondary seal for secondary containment of the reactor primary seal, and/or a perimeter o-ring configured to provide a face seal of the contact sealing system described above. Reactors of various alternative embodiments can therefore include any of the hydrodynamic barrier, floating sleeve, compliance mechanism, primary reactor seal (e.g. material of the floating sleeve, etc.), secondary reactor seal (e.g. o-ring, etc.), and/or perimeter face seal (e.g. o-ring, etc.) individually or in any combination. Thus, each of the hydrodynamic barrier, floating sleeve, compliance mechanism, primary reactor seal (e.g. material of the floating sleeve, etc.), secondary reactor seal (e.g. o-ring, etc.), and/or perimeter face seal (e.g. o-ring, etc.) is not limited to use with another or any particular ones of the hydrodynamic barrier, floating sleeve, compliance mechanism, primary reactor seal (e.g. material of the floating sleeve, etc.), secondary reactor seal (e.g. o-ring, etc.), and/or perimeter face seal (e.g. o-ring, etc.).

The sealing systems of an embodiment include a processing system comprising a reactor block. The reactor block of an embodiment comprises a cell array that includes a plurality of site-isolated reactors (SIRs). The sealing systems of an embodiment include a sleeve coupled to an interior of each of the plurality of SIRs. The sleeve of an embodiment includes a compliance device configured to dynamically control a vertical position of the sleeve in the SIRs. The sealing systems of an embodiment include a sealing system configured to provide a seal between a region of a substrate and the interior of each of the SIRs.

Each sleeve of an embodiment is configured to be dynamically positionable in a respective SIR. The SIR of an embodiment including the sleeve is compliant with a localized surface of the region of the substrate.

The compliance device of an embodiment includes a compliance seal located external to a top portion of the sleeve. The compliance seal of an embodiment is an o-ring positioned between a surface of the top portion of the sleeve and a surface of the reactor block.

The compliance device of an embodiment includes a flexure device integrated in a top portion of the sleeve. The flexure device of an embodiment includes a plurality of grooves in one or more surfaces of the sleeve. The plurality of grooves of an embodiment includes two opposing grooves. A first groove of an embodiment includes an aperture configured to face the reactor block. A second groove of an embodiment includes an aperture configured to face an interior of the SIR.

The sleeve of an embodiment is configured to be replaced.

The sealing system of an embodiment includes a contact sealing system.

The contact sealing system of an embodiment includes a first seal comprising a semi-compliant material of a lower portion of the sleeve.

The contact sealing system of an embodiment includes a second seal. The lower portion of the sleeve of an embodiment is coupled to the second seal. A groove in a surface of the lower portion of the sleeve of an embodiment is configured to accept the second seal. The second seal of an embodiment is an o-ring.

The contact sealing system of an embodiment includes a third seal configured to seal a perimeter of the reactor block to the substrate. The third seal of an embodiment includes a face seal coupled between the reactor block and the substrate. The face seal of an embodiment is an o-ring.

The third seal of an embodiment includes a fluid. The reactor block of an embodiment includes a duct that is configured to deliver the fluid with a pressure. The fluid of an embodiment is air and the pressure is one of a higher pressure and a lower pressure relative to a pressure of the SIRs.

While the sealing system described herein may be described in terms of a "first," "second" and/or "third" seal or, alternatively, a "primary," "secondary" and/or "tertiary" seal, the embodiments are not limited to those having three or any other number of seals. Terms like "first," "second," "third," "primary," "secondary," and/or "tertiary" are used herein only to differentiate between the seals and for no other purpose.

The sealing system of an embodiment includes a plurality of seals. The plurality of seals of an embodiment include a first seal formed with a semi-compliant material of a lower portion of the sleeve and a second seal positioned in a groove of the lower portion of the sleeve. A portion of the groove of an embodiment comprises the semi-compliant material.

The sealing system of an embodiment includes a hydrodynamic sealing system.

The hydrodynamic sealing system of an embodiment includes a first seal formed with a sealing fluid. The sealing fluid of an embodiment forms a hydrodynamic barrier that encapsulates the region of the substrate within a respective SIR.

The sealing system of an embodiment includes a first set of channels in the reactor block. The first set of channels of an embodiment is configured to deliver the sealing fluid to the region of the substrate. The delivered fluid of an embodiment forms the hydrodynamic barrier.

The sealing system of an embodiment includes a second set of channels in the reactor block. The second set of channels of an embodiment is configured to remove the sealing fluid from an area of the hydrodynamic barrier. The second set of channels of an embodiment is configured to remove reaction effluents from the SIR.

The sealing system of an embodiment comprises a bearing device that controls at least one parameter of the sealing fluid. The bearing device of an embodiment controls a float height of each SIR relative to the region. Parameters of the sealing fluid of an embodiment include one or more of temperature, pressure, composition, viscosity, flow state, and flow rate.

The sealing fluid of an embodiment is inert relative to reaction components of the respective SIR.

The hydrodynamic sealing system of an embodiment includes a face seal coupled between the reactor block and the substrate. The face seal of an embodiment is an o-ring.

The substrate of an embodiment includes one or more of blanket wafers, patterned wafers, substrates including devices, substrates including functional chips, substrates including functional devices, and substrates including test structures.

One or more regions of the substrate of an embodiment include one or more of semiconductors, integrated circuits, flat panel displays, optoelectronic devices, data storage devices, magnetoelectronic devices, magnetooptic devices, molecular electronic devices, solar cells, photonic devices, and packaged devices.

The SIR and the substrate of an embodiment are configured to move relative to each other.

The sealing systems of an embodiment include a plurality of modules. At least one of the plurality of modules of an embodiment includes at least one SIR of the plurality of SIRs. The at least one SIR of an embodiment is configured for processing of the substrate that includes one or more of molecular self-assembly and combinatorial processing. At least one of materials, processes, processing conditions, material application sequences, and process sequences of an embodiment is different for the processing in at least one region of the substrate from at least one other region of the substrate.

At least one module of the plurality of modules of an embodiment is configured to contain at least one of a plurality of different processes as appropriate to the processing and one or more processes contained in at least one other of the plurality of modules.

The plurality of modules of an embodiment includes at least one of a wet processing module, a dry processing module, and a treatment module.

The wet processing module of an embodiment includes at least one of clean modules, rinse modules, dry modules, electroless deposition modules, and electrochemical deposition modules, wherein the dry processing module includes at least one of plasma processing modules, vapor phase processing modules, ion flux processing modules, radical flux processing modules, neutral flux processing modules, atomic flux processing modules, and chemical flux processing modules, wherein the treatment module includes at least one of annealing modules, laser processing modules, vaporization modules, ultraviolet (UV) treatment modules, and e-beam treatment modules.

The sealing system of an embodiment includes at least one controller coupled and configured to control an environment that includes at least one of an internal environment that is internal to at least one of the plurality of modules and an external environment that is external to at least one of the plurality of modules. The controller of an embodiment controls at least one of temperature, pressure, and composition of the environment.

The processing of an embodiment includes modifying the substrate. The modifying includes one or more of physical modifications, chemical modifications, electrical modifications, thermal modifications, magnetic modifications, photonic modifications, and photolytic modifications.

One or more of the physical modifications, chemical modifications, electrical modifications, thermal modifications, magnetic modifications, photonic modifications, and photolytic modifications of an embodiment include one or more of cleaning, surface modification, surface preparation, deposition, etching, planarization, chemical mechanical planarization, electrochemical mechanical planarization, lithography, patterning, implantation, irradiation, electromagnetic irradiation, microwave irradiation, radio frequency (RF) irradiation, thermal treatment, infrared (IR) treatment, ultraviolet (UV) treatment, deep ultraviolet (DUV) treatment, extreme ultraviolet (EUV) treatment, electron beam treatment, and x-ray treatment.

The deposition of an embodiment includes one or more of electrochemical deposition, electroless deposition, physical vapor deposition, chemical vapor deposition, atomic layer deposition, vapor phase epitaxy, liquid phase epitaxy, chemical beam epitaxy, molecular beam epitaxy, molecular self-assembly, and evaporation, wherein surface modification includes functionalization.

The processing of an embodiment includes modifying at least one of the two or more regions of the substrate using one or more predefined sequence of modifications.

The processing of an embodiment includes modifying at least one of the two or more regions using a predefined sequence of modifications and modifying the at least one other region using a different predefined sequence of modifications.

The processing of an embodiment includes one or more of sequentially processing regions of at least one group of regions and simultaneously processing regions of at least one other group of regions.

At least one module of the plurality of modules of an embodiment is configured to characterize the substrate.

The characterizing of an embodiment includes one or more of sequentially characterizing regions of at least one group of regions and simultaneously characterizing regions of at least one other group of regions. The characterizing of an embodiment includes characterizing at least one region of the substrate for material properties that include one or more of optical properties, chemical composition, chemical reactivity, electrical properties, physical properties, magnetic properties, thermal properties, mechanical properties, and porosity. The characterizing of an embodiment includes characterizing at least one region of the substrate for structural properties that include one or more of material location, material distribution, material thickness, material step coverage, material continuity, and mechanical properties. The characterizing of an embodiment includes parametric testing of at least one region of the substrate that includes testing for one or more of yield, via chain yield, line yield, via resistance, line resistance, Kelvin resistance, leakage, and capacitance. The characterizing of an embodiment includes device testing of at least one region of the substrate. Device testing of an embodiment is selected from one or more of operational frequency, switching speed, power dissipation, mobility, transconductance, drive current, threshold voltage, capacitance, resistance, and charge density. The characterizing of an embodiment includes reliability testing of at least one region of the substrate that includes testing for one or more of stress migration, electromigration, bias thermal stress, thermal stress, mechanical stress, environmental stress of at least one environmental parameter, and time dependent dielectric breakdown.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the sealing systems and methods is not intended to be exhaustive or to limit the sealing systems and methods to the precise form disclosed. While specific embodiments of, and examples for, the sealing systems and methods are described herein for illustrative purposes, various equivalent modifications are possible within the scope of the sealing systems and methods, as those skilled in the relevant art will recognize. The teachings of the sealing systems and methods provided herein can be applied to other processing systems and methods, not only for the systems and methods described above.

The elements and acts of the various embodiments described above can be combined to provide further embodiments. These and other changes can be made to the sealing systems and methods in light of the above detailed description.

In general, in the following claims, the terms used should not be construed to limit the sealing systems and methods to the specific embodiments disclosed in the specification and the claims, but should be construed to include all processing systems that operate under the claims. Accordingly, the sealing systems and methods are not limited by the disclosure, but instead the scope of the sealing systems and methods is to be determined entirely by the claims.

While certain aspects of the sealing systems and methods are presented below in certain claim forms, the inventors contemplate the various aspects of the sealing systems and methods in any number of claim forms. Accordingly, the inventors reserve the right to add additional claims after filing the application to pursue such additional claim forms for other aspects of the sealing systems and methods.

What is claimed is:

1. A processing system comprising:
   a. a reactor block comprising a cell array that includes a plurality of site-isolated reactors (SIRs);
   b. a sleeve disposed within an interior of each of the plurality of SIRs, the sleeve configured within the interior and including a compliance device configured to dynamically control a vertical position of the sleeve in the SIRs;
   c. a sealing system configured to provide a seal between a region of a substrate and the interior of each of the SIRs; and
   d. wherein the sealing system includes a hydrodynamic sealing system having a first seal formed with a sealing fluid, wherein the sealing fluid forms a hydrodynamic barrier that encapsulates the region of the substrate within a respective SIR.

2. The system of claim 1, comprising a first set of channels in the reactor block, the first set of channels configured to deliver the sealing fluid to the region of the substrate, wherein the delivered fluid forms the hydrodynamic barrier.

3. The system of claim 1, comprising a second set of channels in the reactor block, the second set of channels configured to remove the sealing fluid from an area of the hydrodynamic barrier.

4. The system of claim 1, further comprising a bearing device that controls at least one parameter of the sealing fluid, wherein the bearing device controls a float height of each SIR relative to the region.

* * * * *